United States Patent
Kirihata

(10) Patent No.: US 6,326,800 B1
(45) Date of Patent: *Dec. 4, 2001

(54) SELF-ADJUSTING BURN-IN TEST

(75) Inventor: Toshiaki Kirihata, Poughkeepsie, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/329,895

(22) Filed: Jun. 10, 1999

(51) Int. Cl.[7] .......................... G01R 31/02; G01R 31/00; G01R 31/28
(52) U.S. Cl. .......................... 324/760; 324/763; 702/118; 714/733
(58) Field of Search .................................... 324/760, 765, 324/551, 763, 73.1; 702/81, 182, 183, 118; 714/733

(56) References Cited

U.S. PATENT DOCUMENTS

| 5,030,905 | * | 7/1991 | Figal | 324/760 |
| 5,420,513 | * | 5/1995 | Kimura | 324/551 |
| 5,907,492 | * | 5/1999 | Akram et al. | 700/121 |
| 6,175,812 | * | 1/2001 | Boyington et al. | 702/118 |

\* cited by examiner

Primary Examiner—Safet Metjahic
Assistant Examiner—Anjan K. Deb
(74) Attorney, Agent, or Firm—H. Daniel Schnurmann

(57) ABSTRACT

A method and apparatus for providing a self-adjusting burn-in test to a device-under-test by dynamically regulating critical burn-in test parameters, such as the supply voltage, and modifying the test conditions, avoiding in the process over and under burn-in. More specifically, the method includes setting an initial set of burn-in operating test conditions and repeatedly adjusting the burn-in operating test conditions while performing the burn-in test until a predetermined reliability target is achieved. The apparatus being described includes a test target, a tester, a reliability analyzer, and a burn-in controller. With this system, the number of fails are measured during burn-in, and the final number of fails after completion of the burn-in test is extrapolated. If the number of fails exceeds a stated reliability objective, the burn-in conditions specified by burn-in controller are reduced, thereby avoiding over burn-in or in the alternative under-burn.

15 Claims, 4 Drawing Sheets

SELF-ADJUSTING BURN-IN TEST

FIELD OF THE INVENTION

This invention relates generally to testing semiconductor wafers, chips and multi-chip modules and, more particularly, to a dynamic, adjustable, burn-in test to avoid over or under-burning effects, thereby improving reliability and performance margins of a technology.

BACKGROUND OF THE INVENTION

CMOS technology has evolved such that the computer market has rapidly opened up to a wide range of consumers. Today's multi-media computer uses over 300 MHz microprocessor with 64 MB main memory. In the near future, 1 Gb micro-processor with a 1 GB main memory will become commonplace, which suggests a potentially strong research and development for Giga-Hz and Giga-Byte products, particularly, in products using deep sub-micron technology. Despite the performance, density, and lithographic difficulties, it is even more important in the integrate circuit (IC) marketplace to offer customers a chip which is highly reliable at a competitive cost. To achieve reliability, burn-in testing at the module level is performed to identify weak chips that may be present before they are shipped to a customer. Defective chips found at module burn-in are routinely discarded since they are not readily repairable by on-chip redundancy replacement configurations. This results in higher module costs and lost chip yield.

In view of this problem, and as a possible solution to resolve it, an improved wafer burn-in testing is described herein. Once a weak chip at the wafer level has been detected, it may be repaired if the number of defective elements are less than the number of available redundant repair circuits.

Presently, wafer burn-in methodology applies a static burn-in condition. This is accomplished by accelerating the rate at which marginally functioning cells will fail with time. Practitioners in the art will fully realize that reliability fails have a propensity of occurring over a period of time. There are a number of failures that occur the first time a chip is powered-up. However, there is, additionally, a number of failures occurring subsequently as time passes by. The goal is to ship only chips where, ideally, little likelihood exists of additional fails showing up. Since this may easily take days of power-up operation before the number of failures stabilizes, various methods have been implemented to accelerate this process. One of most commonly used approaches to accelerate this process is to apply a voltage which is 1.5× higher the normal power supply voltage. However, because of process parameter variation in the fabrication of the chip, using 1.5× voltage to a chip can either cause over burn-in or under burn-in. With over burn-in, a reliable chip is destroyed; with under burn-in, a chip which is not reliable may be shipped.

The goal of wafer burn-in is to guarantee chip reliability, without destroying chips and reducing in the process manufacturing yield. It is difficult to realize this goal when a static burn-in condition (1.5× voltage) is provided for all chips at burn-in, unless the chip is over designed, in which instance chip performance is sacrificed. What is needed is a way of applying the best level of burn-in voltage at all times during testing. In the design of a chip, there exists a range of variables which must be taken into account and balanced against each other. These variables include wafer yield and key chip performance parameters such as speed, access time, and power dissipation. This collection of variables define what is referred to as the design space. Clearly, various trade-offs exist between getting the best performance versus an optimum wafer yield versus reliability. Traditionally, the very best possible performance is sacrificed for wafer yield and reliability so that the cost per chip is kept low. A large part of this trade-off involves using a lower internal voltage supply for better burn-in and selecting reliability over keeping the internal voltage supply high for better performance.

FIG. 1 shows an example that illustrates some drawbacks found in conventional static burn-in methods applicable to memory chips. Pass gate 100 couples an input to an output terminal, the output terminal being coupled to a load capacitance C 110. The resistance of the pass gate is R. The time constant t from input to output is therefore R×C. It is assumed that the nominal gate voltage (Vg) of the transfer gate is 3.3V and nominal oxide thickness (Tox) of pass gate 100 is 6.2 mn, applicable to case (a). The reliability parameter is defined as the electric field applied to the oxide of pass gate 100, i.e., Vg/Tox=5.3 MV/cm. However, because of process deviations, Tox may vary between 6.5 nm and 5.8 mn, and Vg may vary depending on the chip between 3.15V and 3.45V, as shown in cases (b) and (c). In case (b), the resistance R of pass gate 100 is increased, because Vg is lower and Tox is thicker than the nominal case (a). This, in turn, reduces the transfer speed Δt by 2 ns. In case (c), t is improved by 2 ns, because of a lower R due to a higher Vg and a thinner Tox. However, the electric field oxide stress increases to 6.1 MV/cm, which is likely to destroy pass gate 100 during burn-in when the Vg voltage is boosted to 1.5×Vg for acceleration of the stress at high temperatures. It is desirable to allow the nominal value of Vg to shift towards a greater performance, as in case (b), if the test methodology were to capture the chips at a high reliability. Similarly, it is also preferable to shift towards greater reliability, as in case (c), if the test methodology were to capture those chips at a lower reliability.

Ideally, it is highly advantageous to dynamically adjust operating conditions during burn-in. Present burn-in setups are not capable of providing feedback from existing burn-in conditions and from chip operation. Such a situation requires to be supported by appropriate on-chip circuitry to analyze the chip response during burn-in test in real time.

OBJECTS OF THE INVENTION

Accordingly, it is an object of the invention to provide a method for providing a self-adjusting burn-in test to a device-under-test (DUT) and, more particularly, memory chips.

It is another object to self-adjust critical burn-in test parameters, such as Vg, etc., to dynamically modify the test conditions to avoid over and under burn-in.

It is yet another object to provide an apparatus which can monitor and self-adjust critical device parameters during the course of burn-in.

It is still another object to improve the reliability of chips being shipped by eliminating weak chips likely to fail early in their lifetime.

It is a further object to improve reliability by using lower internal voltages for better burn-in.

BRIEF DESCRIPTION OF THE DRAWINGS

These and other objects, aspects and advantages of the present invention will be better understood by the following detailed description when taken in conjunction with the accompanying drawings, in which.

SUMMARY OF THE INVENTION

Broadly speaking, the invention relates to techniques for dynamically self-adjusting a burn-in test to avoid over or under burning effects in order to improve the reliability and the performance margins of a given technology.

In a first aspect of the invention, there is provided an arrangement of various apparatus, which jointly form a system for achieving the stated objectives, and which includes a test target, a tester, a reliability analyzer, and a burn-in controller. With this system, the number of failures are measured during burn-in, and the final number of failures is extrapolated. If the number of failures exceeds a stated reliability objective, the burn-in conditions specified by burn-in controller are reduced, thereby avoiding over burn-in.

In another aspect of the invention, there is provided a method for self-adjusting burn-in operating test conditions applied to a device-under-test (DUT) which includes the steps of: a) setting initial burn-in operating conditions; b) measuring a number of fails occurring during a burn-in test; c) statistically determining a saturation point by extrapolating the number of fails expected upon completion of the burn-in test; d) adjusting the burn-in operating conditions; and e) repeating steps b) through d) until achieving a predetermined reliability target.

DETAILED DESCRIPTION OF THE INVENTION

Embodiments of the invention are discussed below with reference to the drawings. However, those skilled in the art will readily appreciate that the detailed description given herein with respect of the figures is for explanatory purposes only as the invention extends beyond these limited embodiments.

The invention will be best understood when the self-adjusting test is performed such that all critical test parameters are self-adjusted and optimized by an apparatus designed for this purpose.

Figure 1:
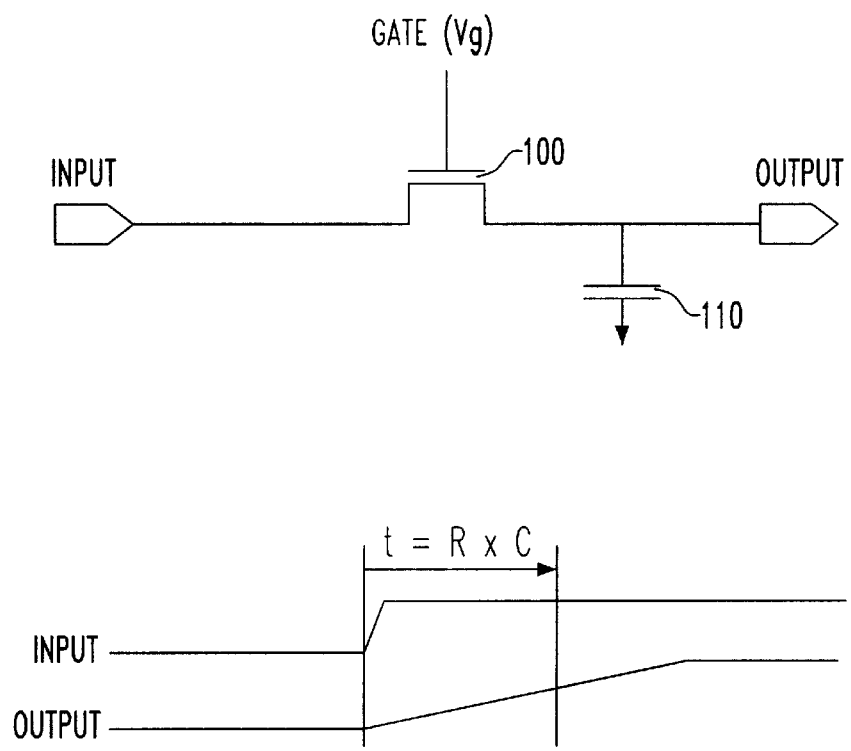
FIG. 1 shows an example that illustrates typical variations with respect to a nominal Vg, Tox and Δt present in a conventional static burn-in method, applicable to memory chips.
Figure 2:
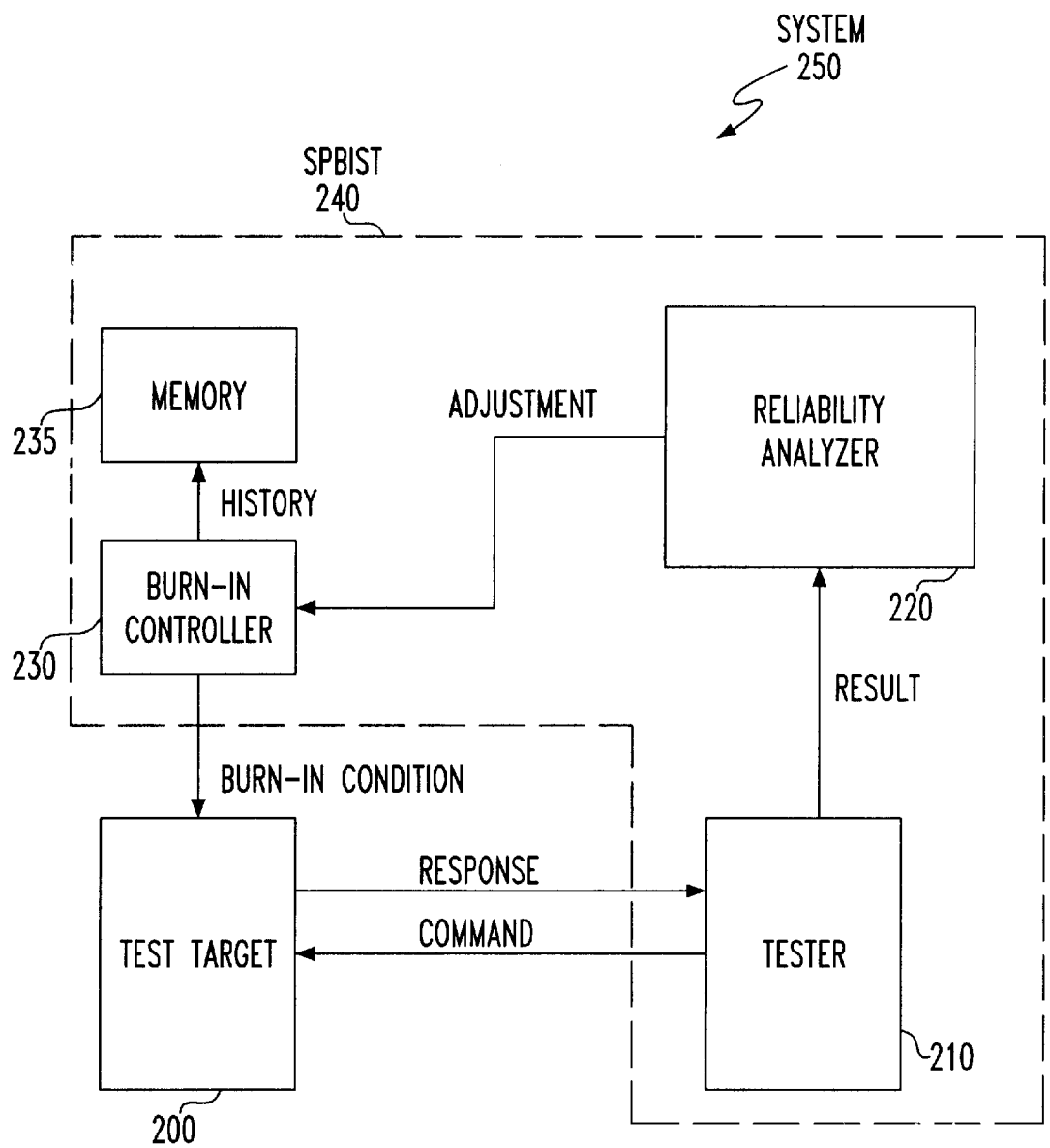
FIG. 2 shows an apparatus designed to provide an adjustable burn-in test, in accordance with the present invention.

Referring to FIG. 2, there is shown a stripped down version of an apparatus designed to dynamically provide the best burn-in test conditions, in accordance with the invention. This system, referenced by numeral 250 includes: test target 200, tester 210, reliability analyzer 220, and burn-in controller 230. Test target 200 is enabled by a command generated by tester 210. Tester 210 measures the response from test target 200 for a given command. Then, the tester generates a test result such as go-no go, it also provides current and voltage measurements by detecting the response from test target 200. The results are analyzed by reliability generator 220, which determines the reliability of the test target 200, such as over burn-in, under burn-in, too much margin at a given burn-in condition, etc. The reliability analyzer 220 determines the reliability of the test target 200 directly or indirectly. Burn-in controller 230 is controlled by the reliability determined by reliability analyzer 220. This allows dynamically adjusting burn-in conditions applied to the test target 200.

In another, more indirect approach, the reliability analyzer 220 measures the number of fails during the burn-in, and predicts the final number of failures. If the number of failures exceeds a stated reliability objective, the burn-in conditions specified by burn-in controller 230 are reduced, thereby avoiding over burn-in.

In the direct method, reliability analyzer 220 analyzes an electric field (E) with a process parameter such as Tox and voltage measured by tester 210. If E is higher than the nominal value, less severe burn-in conditions (lower voltage) are provided by burn-in controller 230 and applied in the following burn-in procedure. Nominal conditions, such as voltage in test target 200 are updated to make it possible to generate burn-in conditions on-the-fly, e.g., for voltage conditions, it would generally be the burn-in voltage/1.5.

Figure 3:
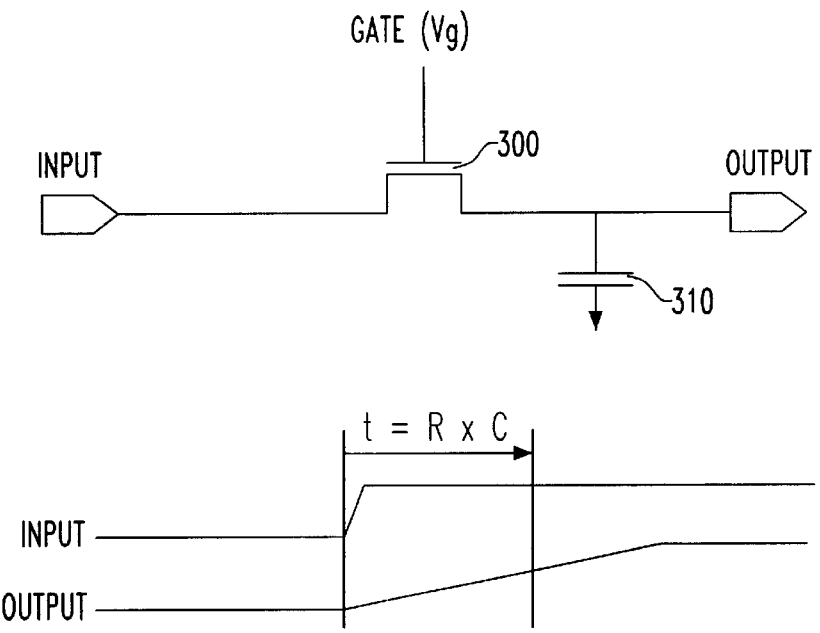
FIG. 3 shows an example of how self-adjusting burn-in test conditions are created to maximize the efficiency of the burn-in test, in accordance with the invention.

FIG. 3 shows an example of how this self-adjustable burn-in concept is applied to pass gate 300. Three cases for the oxide thickness: (a) Tox =6.2 mn, (b) Tox=6.5 mn, and (c) Tox=5.8 mm have been selected to illustrate the burn-in test in accordance with the present invention. It is assumed that the burn-in voltage is 1.5×nominal Vg. Step 1 shows the pass gate condition and burn-in conditions at the start of the self adjustable burn-in test. Step I (wherein i>1) shows the pass gate and burn-in conditions sometime during the self adjustable burn-in. The last step shows the pass gate and burn-in conditions after completing the self-adjustable burn-in test. Unlike conventional burn-in methods, the burn-in voltage Vg×1.5 is dynamically self-adjusted and controlled to protect from over-burn, as in case (c), and improve the performance of the chip, provided that the test target is deemed to have adequate reliability, as in case (b).

Optionally, system 250 can have a memory 235 to store the history of the various burn-in conditions. This makes it possible for the test target voltage 200 to be adjusted later on. The target voltage of the adjustment is derived from the history stored in memory 235. The nominal voltage adjustment is achieved by programming fuses. Tester 210, reliability analyzer 220, burn-in controller 230, and optional memory 235 can be positioned on-chip or off-chip. When they are integrated on the same chip as the test target, they may advantageously be implemented using a conventional self-programmable built-in self-test (SPBIST), known in the art.

The invention described herein further involves a testing method which may actually embodied using a traditional stand-alone tester, a SPBIST apparatus, or any other equivalent apparatus provided with similar characteristics. Two detailed preferred embodiments will now be described: (1) an indirect method with fail predictor in saturation, and (2) a direct method provided with a Tox monitor.

Indirect Method with Fail Predictor in Saturation

Test target 200 in FIG. 2 illustrates a burn-in test having the following default parameters: 1.4×nominal voltage (1.4× 3.3V=4.62V) at a high temperature (150° C.). Applying 1.4×nominal voltage (less severe burn-in condition) protects the test target having a thinner Tox or a higher Vg. Tester 210 measures the number of fails of the test target 200 as a function of time. The reliability analyzer 220 analyzes the number of the fails as a function of time and predicts the saturation point after burn-in. The saturation point is once again defined as the projected number of fails statistically expected for a given power supply voltage or operating point upon completion of the burn-in test. Alternatively, the saturation point may be viewed from the perspective of a statistical number of fails projected beyond which no additional fails are expected for a given voltage value. It is important that, ultimately, the saturation point be a number which is less than the number of circuits available for repair. By way of example, if the available number of repairs is 100, the expected (designed for) saturation point should be no more than, e.g., 70 (in order to provide for an adequate margin of safety). Accordingly, the saturation point is a function of the design in combination with the statistical variation in the fabrication process. Indeed, if a given chip exceeds the available number of repairs, the chip needs to be disposed of since there no adequate repair means available to repair the chip under test.

The saturation point is found using a 'best fit', or more particularly, by utilizing a mathematical distribution, such as gaussian, or polynomial. Following is an example of how to predict the saturation point with a polynomial of a second order):

$$x=a*t*t+b*t+c$$

wherein:

t represents the time, and x, the number of fails after time t.

For a given voltage, a, b, and c are calculated by observing three points (x0,t0), (x1,t1), and (x2,t2).

$$x0=a*t0*t0+b*t0+c$$

$$x1=a*t1*t1+b*t1+c$$

$$x2=a*t2*t2+b*t2+c$$

The saturation time (tsat) is determined by the following equation:

$$tsat=-b/(2*a*t).$$

Accordingly, tsat for this voltage is $$xsat=a*tsat*tsat+b*tsat+c,$$

wherein xsat represents the number of the fails at tsat.

The ultimate purpose is that the three different test times happen at a point in time which occurs considerably sooner than the time at which saturation ensues. This insures that the number of fails counted for calculating xsat always be less than the total number of fails that would ultimately occur for that particular supply voltage after completing the burn-in test. This prediction is calculated by reliability analyzer 220.

Referring now to the reliability analyzer, it generates a reliability parameter REL defined by:

$$REL=total\#of\ reliability/xsat.$$

A larger number for REL implies that test target 200 is more reliable. In order not to destroy the test target, REL should be a number equal or larger than 1, e.g., 1.3, to provide adequate margin. If REL at any time exceeds 1.3, the reliability analyzer 220 controls the burn-in controllers so that the burn-in voltage of the test target 200 increases. Test target 200 is then tested under different burn-in conditions by tester 210, the reliability of which is, likewise, also analyzed by the reliability analyzer. This process is repeated as needed until REL is less than 1.3. By sampling for saturations at different supply voltages, the best and highest power supply voltage is found at which, ideally, to perform burn-in. This results in that burn-in is performed in the shortest amount of time, the chip is not destroyed from over burn-in, and the highest operational voltage is achieved, wherein the best performance is realized for that chip. The internal operational voltage is programmed on-the-fly during burn-in, or by blowing fuses once burn-in is complete. The chip or module is specified and sorted according to the conditions arrived at during burn-in.

Direct Method with a Tox Monitor

The concept revolves around making a direct measurement of Tox, the oxide thickness by test target 200. The test target contains an oxide thickness Tox monitor and an internal voltage VINT monitor. Tox is measured by tester 210. The reliability analyzer 220 calculates VINT, with electric field E as the target member, preferable of the order of 5.3 MV/cm. Reliability analyzer controls the burn-in controller to use 1.5× the calculated VINT for the self-adjustable burn-in. The VINT monitor of the test target is used for feedback purposes. Because E is always the target number (i.e., 5.3 MV/cm), over burn-in or under burn-in can be avoided. VINT of test target 200 is programmed on-the-fly during burn-in, or by blowing fuses once the burn-in has been completed. The chip or module is specified and sorted in accordance with the conditions arrived at during burn-in.

Figure 4:
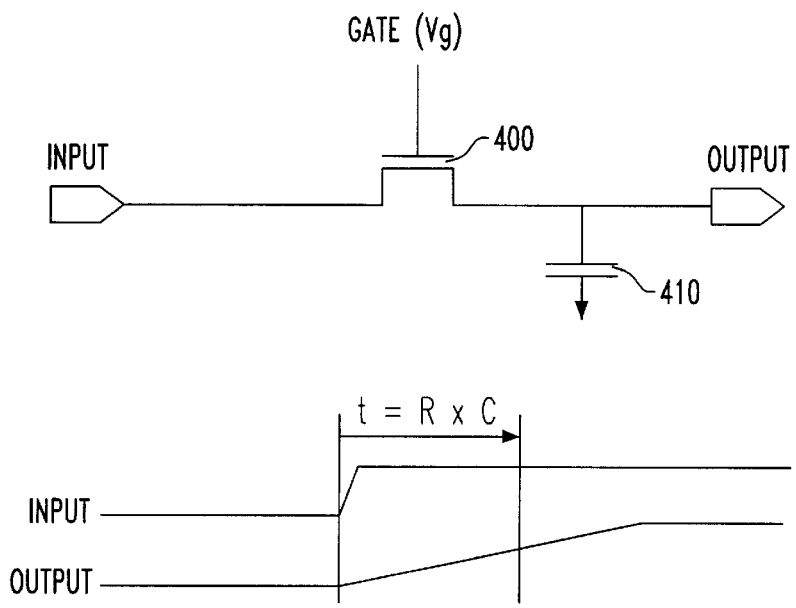
FIG. 4 illustrates an example of programming Vg on-the-fly during burn-in to overcome any situation leading to over burn-in, while improving the chip performance.

FIG. 4 compares side by side conditions pertinent to the parameters defined for the pass gate before and after burn-in test. Pass gate 400 couples the input to the output with load capacitance 410. It is assumed that the nominal gate voltage of the transfer gate is 3.3V and nominal oxide thickness Tox is 6.2 mn, as shown in case (a). However, because of process variations, Tox may vary from 6.5 mn down to 5.8 mn, as illustrated in columns (b) and (c). Similarly, pass gate voltage Vg varies as well. All Tox parameters of test target 200 are measured by tester 210. The reliability analyzer 220 calculates Vg so that E=5.3 MV/cm. The reliability analyzer controls the burn-in, using 1.5× the calculated Vg for a self-adjusting burn-in. The calculated Vg (burn-in Vg) voltages represented for cases (b) and (c) are 3.45V (5.175V in burn-in) and 3.15V (4.725V in burn-in), respectively. The calculated Vg for the test target 200 is programmed on-the-fly during the burn-in, or obtained by blowing fuses once the burn-in is complete. This overcomes over burn-in conditions—case (c), while improving a chip performance in case (b).

The various features and advantages of the present invention are apparent from the written description, and thus, are intended to cover such features and advantages of the invention. Since numerous modifications and changes will readily occur to those skilled in the art, it is not desired to limit the invention to the exact construction and method of operating as illustrated and described. Hence, all suitable modifications and equivalents which may be resorted to are deem to fall within the scope of the invention.

What is claimed is:

1. A method for having a plurality of devices under test (DUT) perform a self-adjusting burn-in test, the method comprising the steps of:

having said DUTs perform their own individual burn-in test at a first voltage;

while performing said burn-in test, having said DUTs monitor their own individual electrical characteristics;

from said monitoring, having said DUTs project their own individual over-burn condition, repeatedly incrementing said first voltage to succeeding voltages as a function of said respective electrical characteristics; and respectively stopping said incrementing said voltages when said over-burn test condition is reached.

2. The method as recited in claim 1, wherein said over-burn test condition is determined by measuring the number of fails occurring within said DUT as a function of time and obtaining a statistical number of said fails beyond which no additional ones of said fails are expected, for a selected voltage value applied to said DUT while performing said burn-in test, said statistical number defining a saturation point.

3. The method as recited in claim 1, wherein said burn-in test conditions are set by a burn-in controller, said burn-in test is performed by a tester and the results of said burn-in test are analyzed by a reliability analyzer.

4. A method for having a plurality of devices under test (DUT) perform a self-adjusting burn-in test, the method comprising the steps of:

having said plurality of DUTs monitor their own individual electrical characteristics;

from said electrical characteristics, having said DUTs determine their own individual burn-in test conditions; and performing said self-adjusting burn-in test under said determined burn-in test conditions.

5. The method of claim 4, wherein said electrical characteristics of said DUTs are a function of their respective oxide thickness.

6. A method for having a plurality of devices under test (DUT) perform a self-adjusting burn-in test, the method comprising the steps of:

having said DUTs perform their own burn-in test at a first voltage;

while performing said burn-in test, having said DUTs measure their own individual electrical characteristics and count the number of fails occurring during said burn-in test;

statistically determining a saturation point by having said DUTs project their own number of individual fails expected upon completion of said burn-in test;

repeatedly incrementing said first voltage to succeeding voltages while said statistically determined saturation point is less than a predetermined number; and respectively stopping incrementing said voltages when said statistically determined saturation point reaches said predetermined number.

7. The method as recited in claim 6, wherein said reliability target is inversely proportional to the number of fails at saturation time.

8. The method as recited in claim 6, wherein said saturation point is a statistical number of said fails projected beyond which no additional ones of said fails are expected for a given voltage value.

9. The method as recited in claim 6, wherein said saturation point (tsat) is determined by a polynomial.

10. The method as recited in claim 6, wherein said saturation point (tsat) is determined by the equation $$tsat = -b/(2*a*t)$$

herein a and b are calculated by a 'best fit' between three observations.

11. The method as recited in claim 6, wherein said predetermined number is determined by an ability of repairing faults as a function of the number of redundancies within said DUT.

12. A method for self-adjusting burn-in operating test conditions applied to a device-under-test (DUT), comprising the steps of:

measuring an electric field of at least one device within said DUT before or during said burn-in-test; and based on said electric field, adjusting burn-in operating conditions.

13. An apparatus for optimizing a burn-in test by avoiding over burn-in and under burn-in conditions, said apparatus comprising:

means for testing a device-under-test (DUT);

means for computing and analyzing testing results of said DUT provided by said means for testing;

means for controlling said burn-in test and for automatically self-adjusting burn-in test conditions based on said analyzed testing results; and means for stopping said burn-in test if over burn-in or under burn-in test conditions are detected.

14. The apparatus as recited in claim 13, wherein said means for computing and analyzing reliability results comprises a means for measuring fails within said DUT during said burn-in test and a means for statistically predicting a number of fails that will accumulate upon completion of said burn-in test.

15. A burn-in test system comprising:

means for performing a burn-in test;

means for analyzing results of said burn-in test;

means for setting and controlling burn-in test conditions;

means for self-adjusting said burn-in test conditions to a device under test biased at a first voltage potential;

means for repeatedly increasing said first voltage potential while performing said burn-in test; and means for detecting when said burn-in test conditions result in an over-burn or under-burn test condition to terminate said burn-in test.

* * * * *